(12) United States Patent
Takeda

(10) Patent No.: US 8,450,810 B2
(45) Date of Patent: May 28, 2013

(54) BIDIRECTIONAL SWITCH

(75) Inventor: Yasuhiro Takeda, Ora-gun (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 49 days.

(21) Appl. No.: 13/188,059

(22) Filed: Jul. 21, 2011

(65) Prior Publication Data
US 2012/0025305 A1    Feb. 2, 2012

(30) Foreign Application Priority Data
Jul. 28, 2010  (JP) .................................. 2010-169462

(51) Int. Cl.
*H01L 27/088*    (2006.01)

(52) U.S. Cl.
USPC .................... 257/397; 257/401; 257/E27.029

(58) Field of Classification Search
USPC ................... 257/397, 401, E27.029; 438/279
See application file for complete search history.

(56) References Cited

U.S. PATENT DOCUMENTS

| | | | | |
|---|---|---|---|---|
| 5,569,949 | A * | 10/1996 | Malhi ............................ | 257/397 |
| 6,548,863 | B2 * | 4/2003 | Patti .............................. | 257/335 |
| 7,232,717 | B1 * | 6/2007 | Choi et al. .................... | 438/238 |
| 7,265,012 | B2 * | 9/2007 | Helm et al. ................... | 438/231 |
| 7,683,369 | B2 * | 3/2010 | Ho et al. ........................ | 257/48 |
| 7,906,810 | B2 * | 3/2011 | Wang et al. ................... | 257/335 |
| 8,018,031 | B2 * | 9/2011 | Yanagida ...................... | 257/621 |
| 2010/0244125 | A1 * | 9/2010 | Sonsky et al. ................ | 257/330 |

FOREIGN PATENT DOCUMENTS

| | | |
|---|---|---|
| JP | 11-224950 | 8/1999 |
| JP | 2002-118258 | 4/2002 |
| JP | 2004-274039 | 9/2004 |

\* cited by examiner

*Primary Examiner* — George Fourson, III
(74) *Attorney, Agent, or Firm* — Morrison & Foerster LLP

(57) ABSTRACT

An ON resistance of a bidirectional switch with a trench gate structure composed of two MOS transistors sharing a common drain is reduced. A plurality of trenches is formed in an N type well layer. Then a P type body layer is formed in every other column of the N type well layer interposed between a pair of the trenches. A first N+ type source layer and a second N+ type source layer are formed alternately in each of a plurality of the P type body layers. A first gate electrode is formed in each of a pair of the trenches interposing the first N+ type source layer, and a second gate electrode is formed in each of a pair of the trenches interposing the second N+ type source layer. A portion of the N type well layer interposed between a sidewall on an opposite side of the body layer of the trench in which the first gate electrode is formed and a sidewall on an opposite side of the body layer of the trench in which the second gate electrode is formed makes an N type drain layer serving as an electric field relaxation layer. A cross-sectional area of the N type drain layer makes a path of the ON current.

3 Claims, 8 Drawing Sheets

BIDIRECTIONAL SWITCH

CROSS-REFERENCE OF THE INVENTION

This application claims priority from Japanese Patent Application No. 2010-169462, the content of which is incorporated herein by reference in its entirety.

BACKGROUND OF THE INVENTION

1. Field of the Invention

This invention relates to a bidirectional switch composed of two MOS transistors having a trench type gate structure and sharing a common drain, specifically to the bidirectional switch with a reduced ON resistance.

2. Description of the Related Art

In the case where a secondary battery such as a lithium ion battery is used to provide a load with electric charges stored in it as an electric current, preventing overdischarging as well as re-charging the lithium ion battery or the like is required when discharging has proceeded to a certain extent. Also, it is necessary to control the charging so that the lithium ion battery or the like is not overcharged.

Thus, in order to control the charging and the discharging of the lithium ion battery or the like, there is a need for a bidirectional switch that controls a charging current as well as a discharging current that is completely opposite in a direction of a current flow. Two discrete MOS transistors with their drain electrodes connected with each other are used as the bidirectional switch in the beginning.

In this case, one of source electrodes is connected to a cathode or the like of the lithium ion battery or the like and another source electrode is connected to the load or a battery charger, and electric potentials at the gate electrodes and electric potentials at the source electrodes and the like of the two MOS transistors are controlled by a control IC so that the charging/discharging current of the lithium ion battery or the like is controlled through operations of the bidirectional switching.

However, as portable terminal equipment comes into widespread use, various kinds of components are required to be reduced in their sizes. As the bidirectional switch controlling the charging/discharging current of the lithium ion battery or the like is also required to be more compact, a single bidirectional switch that is composed of two MOS transistors integrated into a single semiconductor die is developed. As an example of the single bidirectional switch, a bidirectional switch with a planar type gate structure is disclosed in Japanese Patent Application Publication No. H11-224950.

However, there is a problem that reducing a cell size and reducing the ON resistance is difficult with the planar type gate structure, because a large area is required to secure a source-drain dielectric breakdown voltage $BV_{DS}$ and because a gate electrode is formed in a horizontal direction on the semiconductor die. On the other hand, Japanese Patent Application Publication Nos. 2004-274039 and 2002-118258 disclose attempts to reduce a pattern size and the ON resistance by adopting a trench type gate structure in which the gate electrode is formed in a vertical direction in the semiconductor die.

FIG. 6 shows a cross-sectional view of a bidirectional switch having the trench type gate. An N type well layer 52 is formed on a P type semiconductor substrate 51. A P type body layer 53 is formed on the N type well layer 52, and a trench 54 extending from a surface of the P type body layer 53 into the N type well layer 52 is formed.

A first gate electrode 56a and a second gate electrode 56b are formed in the trench 54 so that each of them extends from each of both sidewalls to a bottom surface of the trench 54 through a gate insulation film 55. A region in the trench 54 interposed between the first gate electrode 56a and the second gate electrode 56b is filled with an insulation film 64 and its surface is planarized. The N type well layer 52 extending from the both sidewalls to the bottom surface of the trench 54 through the gate insulation film 55 forms N type common drain layers 65a and 65b of both MOS transistors.

The N type drain layer 65a is the N type well layer 52 in a portion between edges of the first gate electrode 56a and the second gate electrode 56b in the bottom surface of the trench 54. Each of the N type drain layers 65b is the N type well layer 52 in a portion extending from each of the sidewalls of the trench 54 to the edge of each of the first and second gate electrodes 56a and 56b in the bottom surface of the trench 54, respectively.

A first N+ type source layer 57 is formed in the P type body layer 53 on one side of the trench 54, and a second N+ type source layer 58 is formed in the P type body layer 53 on another side of the trench 54. A first P+ type contact layer 59 connected to the P type body layer 53 is formed in the first N+ type source layer 57, and a second P+ type contact layer 60 connected to the P type body layer 53 is formed in the second N+ type source layer 58.

An interlayer insulation film 61 is formed on the first and second N+ type source layers 57 and 58 and the like. There are formed a first source electrode 62 connected with the first N+ type source layer 57 and the like through a contact hole formed in the interlayer insulation film 61 and a second source electrode 63 connected with the second N+ type source layer 58 and the like through a contact hole formed in the interlayer insulation film 61. The first and second gate electrodes 56a and 56b are also drawn out onto the interlayer insulation film 61 through contact holes (not shown) formed in the interlayer insulation film 61.

FIGS. 7A and 7B are equivalent circuit diagrams of the bidirectional switch. The bidirectional switch is composed of two MOS transistors sharing a common drain layer D. FIG. 7A shows an electric potential at each of electrodes of the bidirectional switch in an ON state. A high voltage $V_H$ is applied to a first source electrode S1, while a low voltage $V_L$ is applied to a second source electrode S2.

When symbols in FIG. 7A are compared with symbols in FIG. 6, S1 corresponds to the first source electrode 62, S2 corresponds to the second source electrode 63, D corresponds to the common drain layers 65a and 65b, G1 corresponds to the first gate electrode 56a, and G2 corresponds to the second gate electrode 56b. The symbols in FIG. 6 are used in the following explanations.

An N type channel layer (not shown) is formed in a surface of the P type body layer 53 facing each of the gate electrodes 56a and 56b through the gate insulation film 55 by applying a voltage equal to or higher than $V_H$+Vt (threshold voltage) to the first gate electrode 56a and a voltage equal to or higher than $V_L$+Vt to the second gate electrode 56b.

As a result, an ON current flows from the first source electrode 62 at a high electric potential to the common drain layers 65a and 65b through the channel layer on a side of the first source electrode 62. The ON current flown into the common drain layers 65a and 65b further flows into the second source electrode 63 at a low electric potential through the channel formed in the P type body layer 53 on a side of the second source electrode 63. That is, there is formed a current path from the first source electrode 62 to the second source electrode 63.

On the other hand, a current path from the second source electrode 63 to the first source electrode 62 is formed by applying the high voltage $V_H$ to the second source electrode 63 and the low voltage $V_L$ to the first source electrode 62 and an appropriate voltage to each of the gate electrodes 56a and 56b. That is, the bidirectional switching operations can be implemented by setting the appropriate voltage to be applied to each of the electrodes.

FIG. 7B shows voltages applied to the electrodes when the current flowing through the bidirectional switch is turned off and the bidirectional switch is put into an OFF state. The voltage applied to the first gate electrode 56a on the side of the first source electrode 62 at the high voltage $V_H$ is reduced from $V_H+Vt$ to $V_H$, while the voltage applied to the second gate electrode 56b on the side of the second source electrode 63 at the low voltage $V_L$ is reduced from $V_L+Vt$ to $V_L$.

As a result, the both channel layers are eliminated and the ON current is cut off to put the bidirectional switch into the OFF state. In this case, a current path through parasitic diodes formed between the P type body layer 53 and the N type well layer 52 in the two MOS transistors constituting the bidirectional switch is also cut off because the parasitic diode to which the low voltage $V_L$ is applied is reverse-biased.

Since the bidirectional switch described above adopts the trench type gate structure, it is possible to reduce the pattern size. Also, it has high current drive capability to reduce the ON resistance in the ON state. However, it is not sufficient to satisfy requirements on the bidirectional switch to further reduce the ON resistance as the equipment is further reduced in size. Further reduction of the ON resistance in the ON state of the bidirectional switch is required.

SUMMARY OF THE INVENTION

The invention provides a bidirectional switch that includes a semiconductor substrate of a first general conductivity type, a semiconductor layer of a second general conductivity type disposed on the semiconductor substrate, a plurality of trenches formed in the semiconductor layer so that a column is defined between each pair of the trenches, a gate electrode comprising a polysilicon and disposed in each trench, a plurality of body layers of the first conductivity type formed in the semiconductor layer so that a body layer exists in every other column of the semiconductor layer so as to form a transistor, and a source layer of the second conductivity type formed in each body layer. A column of the semiconductor layer in which no body layer is formed is configured to operate as a common drain layer between two pairs of transistors.

DETAILED DESCRIPTION OF THE INVENTION

Figure 1A:
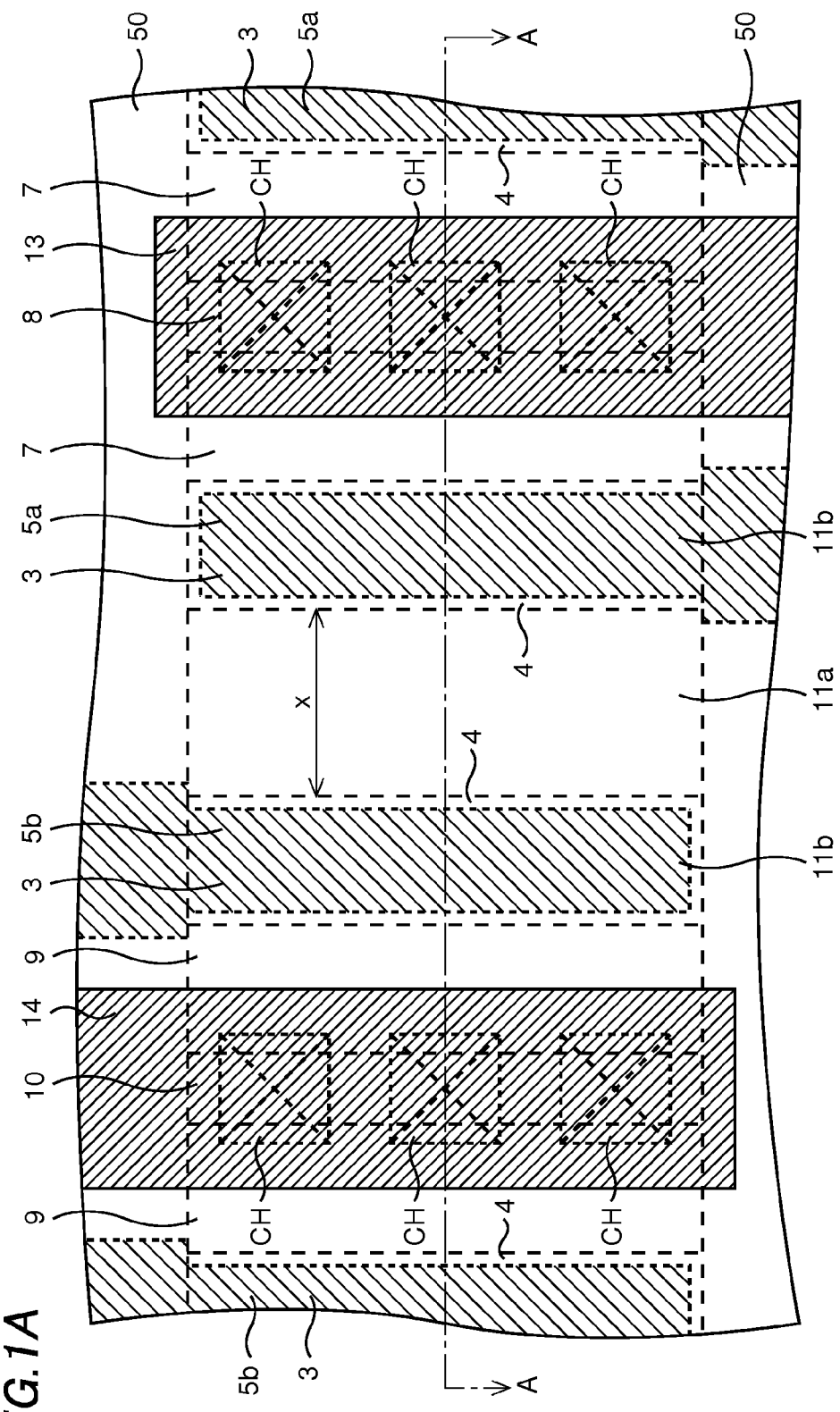
FIG. 1A is a plan view showing a bidirectional switch according to an embodiment of this invention.
Figure 1B:
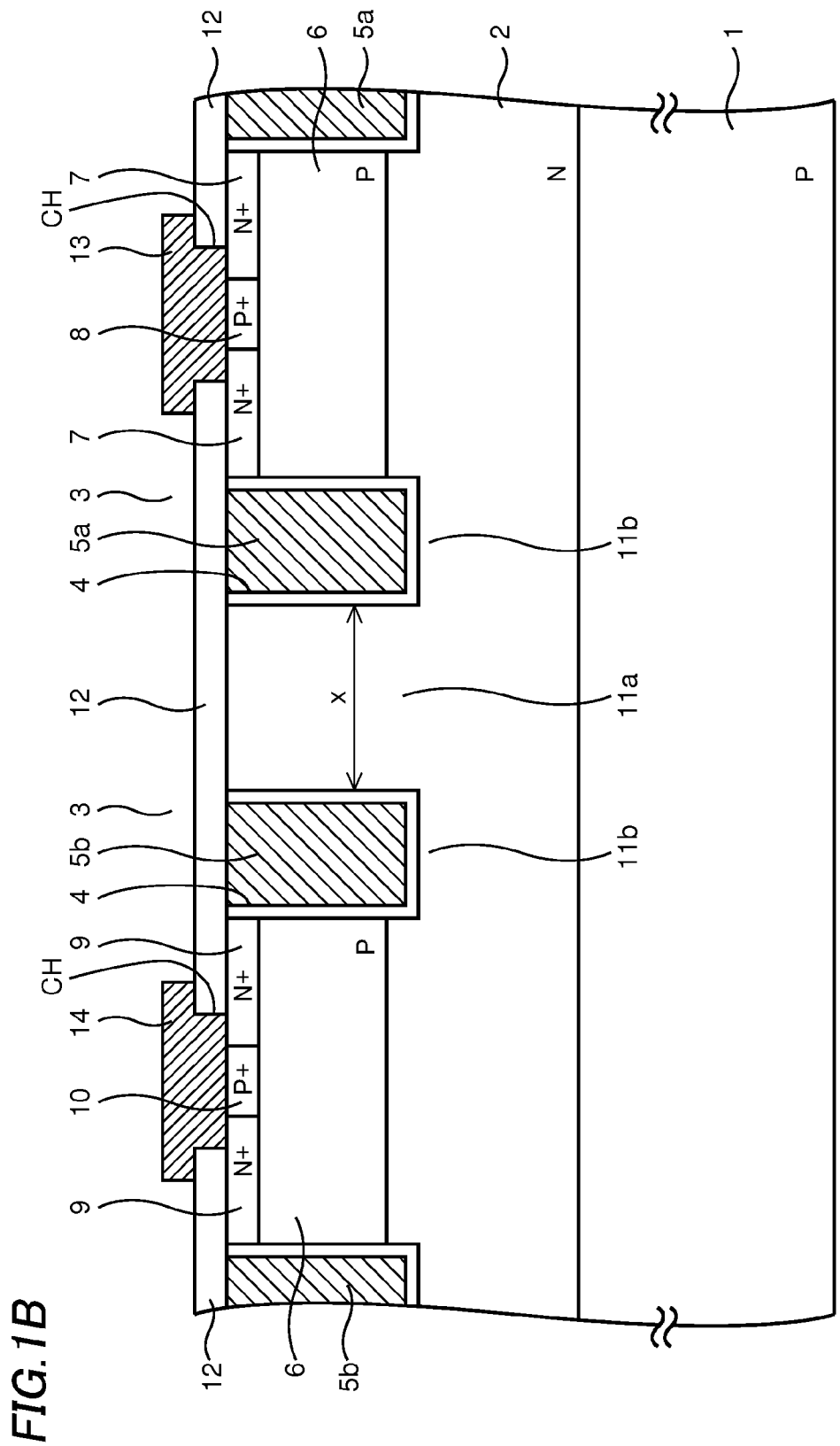
FIG. 1B is a cross-sectional view showing a section A-A in FIG. 1A.

A bidirectional switch according to an embodiment of this invention is described referring to FIG. 1A and FIG. 1B. FIG. 1A is a plan view of the bidirectional switch. The bidirectional switch is formed in a region surrounded by a silicon oxide film 50 formed by a LOCOS (Local Oxidation of Silicon) method. FIG. 1B is a cross-sectional view showing a section A-A in FIG. 1A. An N type well layer 2 is formed on a P type semiconductor substrate 1, as shown in FIG. 1B. A plurality of trenches 3 is formed in the N type well layer 2 from its surface. A plurality of P type body layers 6 is formed so that each of the P type body layers 6 is formed in every other column of the N type well layer 2 interposed between a pair of the trenches 3.

A combination of a first N+ type source layer 7 and a first P+ type contact layer 8 and a combination of a second N+ type source layer 9 and a second P+ type contact layer 10 are formed alternately in each of the plurality of P type body layers 6. A first gate electrode 5a is formed through a gate insulation film 4 in each pair of the trenches 3 interposing the body layer 6 including the first N+ type source layer 7. A second gate electrode 5b is formed through a gate insulation film 4 in each pair of the trenches 3 interposing the body layer 6 including the second N+ type source layer 9. It is noted that conductivity types, such as N+, N and N−, belong in a general conductivity type and conductivity types, such as P+, P and P−, belong in the other general conductivity type.

A portion of N type drain layer 11a serving as an electric field relaxation layer is formed in a portion of the N type well layer 2 interposed through the gate insulation film 4 between the trench 3 in which the first gate electrode 5a is formed and the trench 3 in which the second gate electrode 5b is formed. An N type drain layer 11b is formed in a portion of the N type well layer 2 extending from a bottom surface of each of the trenches 3 to its side surface on a side of the P type body layer 6, and also serves as an electric field relaxation layer.

Figure 2:
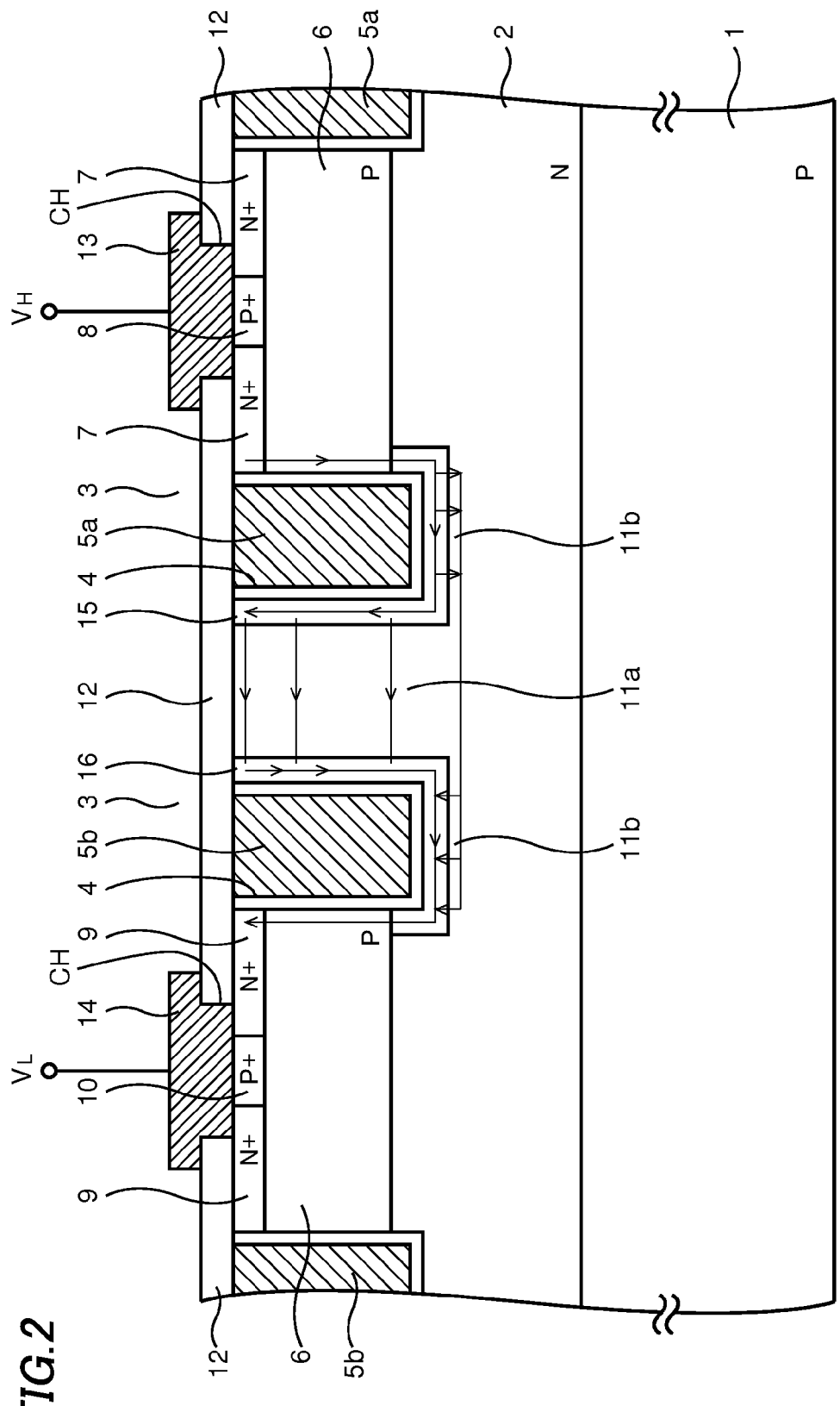
FIG. 2 is a cross-sectional view showing a path of an ON current of the bidirectional switch according to the embodiment of this invention.

A channel layer (not shown) made of an N type inversion layer is formed in a surface of the P type body layer 6 facing each of the first gate electrode 5a and the second gate electrode 5b through the gate insulation film 4 on a sidewall of the trench 3 when an appropriate voltage is applied to each of the first gate electrode 5a and the second gate electrode 5b, respectively. Also, there are formed N type accumulation layers 15 and 16 in surfaces of the N type drain layers 11a and 11b facing the sidewall or the bottom surface of the trenches 3 through the gate insulation film 4 as shown in FIG. 2, when the appropriate voltages are applied to the first gate electrode 5a and the second gate electrode 5b.

Making a portion of a width x of the N type well layer 2 interposed through the gate insulation film 4 between the gate electrodes 5a and 5b formed in the two trenches 3 as a portion of the N type drain layer 11a and using it as a path of an ON current in an ON state of the bidirectional switch is a feature of this invention.

Figure 6:
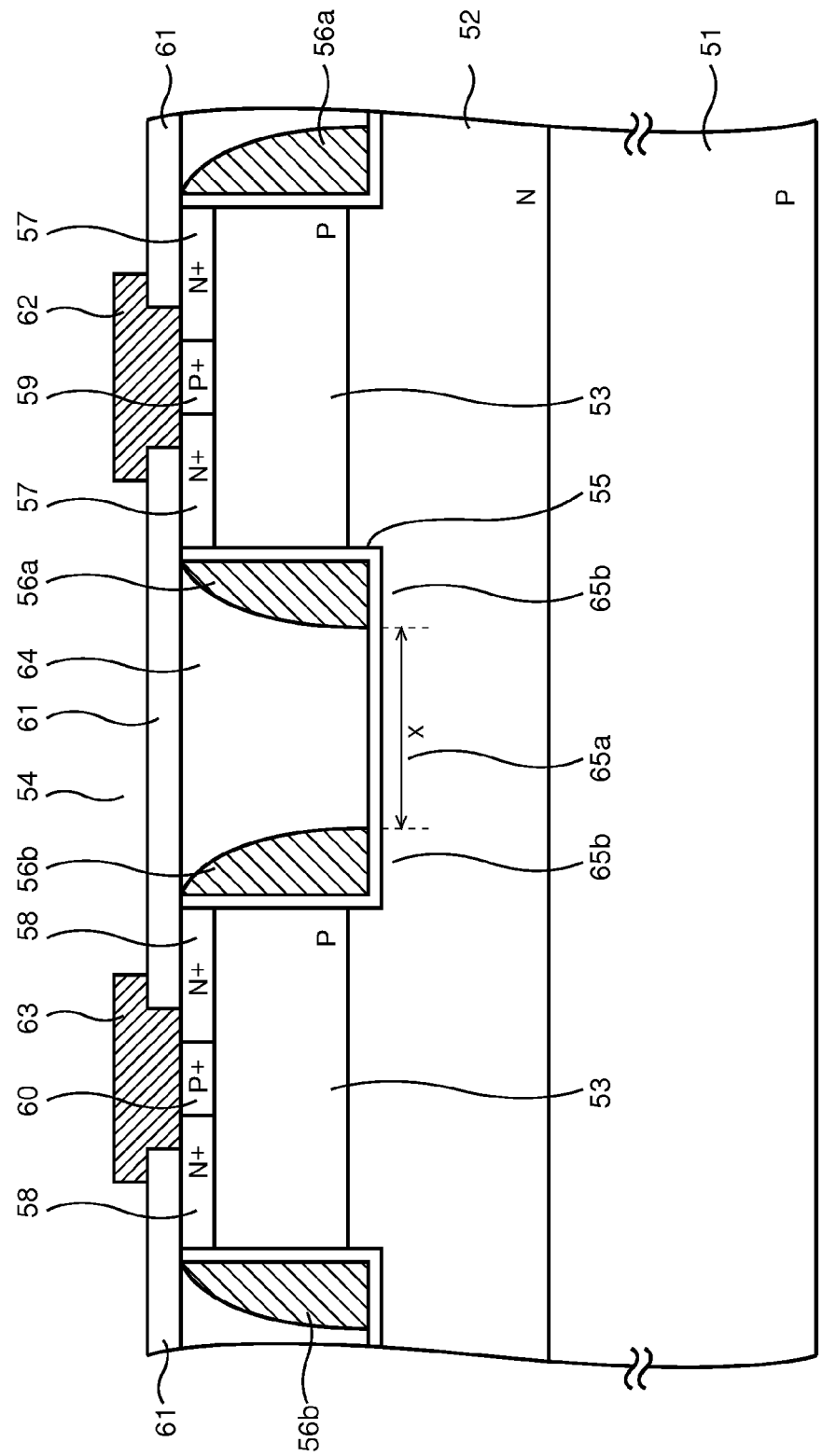
FIG. 6 is a cross-sectional view showing a conventional bidirectional switch.

Only the insulation film 64 exists between the two gate electrodes 56a and 56b in the conventional bidirectional switch that is shown in FIG. 6. The ON current cannot use the insulation film of a width x between the two gate electrodes 56a and 56b as a current path. Only the N type drain layers 65a and 65b extending below the bottom surface of the trench 54 through the gate insulation film 55 make the path of the ON current.

There is formed a first source electrode 13 connected with the first N+ type source layer 7 and the first P+ type contact layer 8 through a contact hole CH formed in an interlayer insulation film 12 that is deposited over the semiconductor substrate 1 including the first N+ type source layer 7 and the like. A second source electrode 14 connected with the second N+ source layer 9 and the second P+ type contact layer 10 is formed similarly. The gate electrodes 5a and 5b are also drawn out onto the interlayer insulation film 12 through gate draw-out electrodes (not shown).

Figure 7A:
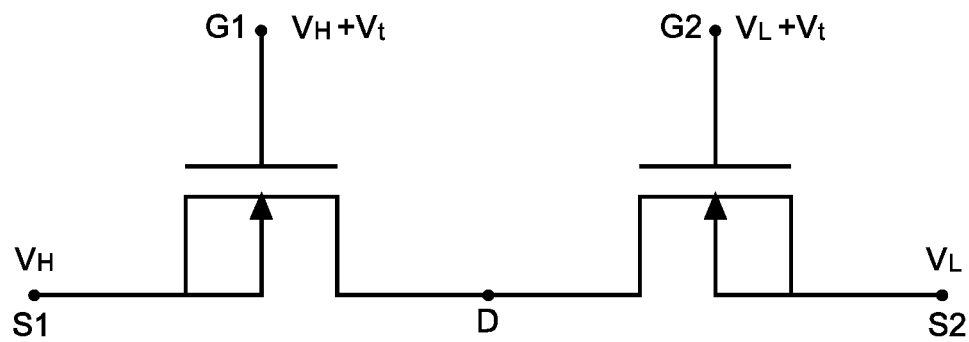
FIGS. 7A and 7B are circuit diagrams showing biasing of the electrodes of the bidirectional switch made of two MOS transistors sharing a common drain in an ON state and in an OFF state, respectively.
Figure 7B:
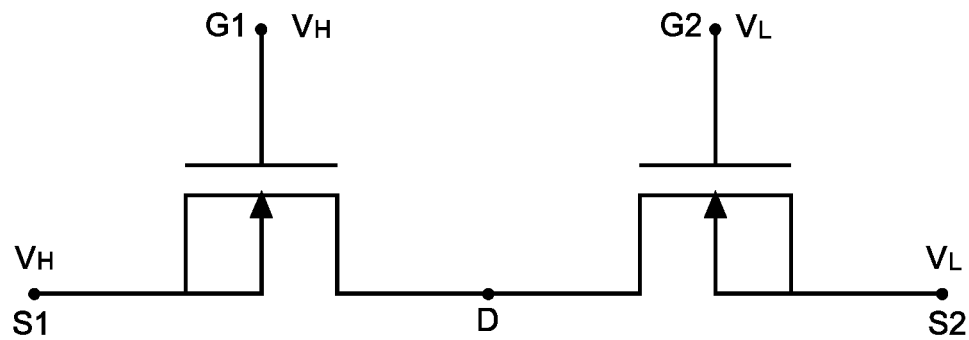

Operations of the bidirectional switch structured as described above are explained in detail referring to FIG. 2, FIG. 3 and FIGS. 7A and 7B. FIGS. 7A and 7B show bias voltages applied to the electrodes of the bidirectional switch in the ON state and in the OFF state, respectively. FIG. 7A shows the bias voltages in the ON state, and FIG. 7B shows the bias voltages to turn the bidirectional switch from the ON state to the OFF state.

When the bidirectional switch is in the ON state, a voltage higher than a high voltage by at least Vt is applied to the gate electrode on a side of the source electrode to which the high voltage is applied, while a voltage higher than a low voltage by at least Vt is applied to the gate electrode on a side of the source electrode to which the low voltage is applied.

As a result, the channel layer is formed in the P type body layer 6 in each of the MOS transistors, and the ON current flows from the source electrode at the high electric potential to the source electrode at the low electric potential. The ON current flows in either direction depending on which of the source electrodes is placed at the high electric potential.

Arrows in FIG. 2 indicate a path of the ON current that flows from the first source electrode 13 to the second source electrode 14 when the bidirectional switch is turned into the ON state by applying the high voltage $V_H$ to the first source electrode 13, $V_H$+Vt to the first gate electrode 5a, the low voltage $V_L$ to the second source electrode 14 and $V_L$+Vt to the second gate electrode 5b.

Since the voltage $V_H$+Vt that is higher than the electric potential $V_H$ at the P type body layer 6 connected with the first source electrode 13 through the P+ type first contact layer 8 is applied to the first gate electrode 5a, a first N type channel layer (not shown) is formed in the P type body layer 6 at the interface with the gate insulation film 4. Also, electrons are attracted by the gate electrode 5a at the high electric potential so that a first N type accumulation layer 15 is formed in the N type drain layers 11a and 11b made of portions of the N type well layer 2 at the interface with the gate insulation film 4, as shown in FIG. 2.

Similarly, a second N type accumulation layer 16 is formed in the N type drain layers 11a and 11b at the interface with the gate insulation film 4 on the second gate electrode 5b, and a second N type channel layer (not shown) is formed in the P type body layer 6 at an interface with the gate insulation film 4 on the second gate electrode 5b. A width of the first N type accumulation layer 15 and a width of the second N type accumulation layer 16 are shown exaggerated in FIG. 2 for better understanding of the current flow.

The path of the ON current from the first source electrode 13 to the second source electrode 14 is as follows. First, the ON current flown from the first source electrode 13 into the N+ type source layer 7 further flows into the first N type accumulation layer 15 formed in the N type drain layer 11b at the interface with the gate insulation film 4 below the P type body layer 6 through the first N type channel layer (not shown) as indicated by an arrow.

Most of the ON current flown into the first N type accumulation layer 15 flows through the low resistance first N type accumulation layer 15 formed below the bottom surface of the trench 3. A portion of the ON current flows out of the first N type accumulation layer 15 to the N type drain layers 11b and 11a and flows toward the N type drain layer 11b below the trench 3 in which the second gate electrode 5b is formed.

The ON current flowing through the low resistance first N type accumulation layer 15 formed below the bottom surface of the trench 3 mainly flows into the low resistance first N type accumulation layer 15 formed through the gate insulation film 4 on the sidewall of the trench 3 in which the first gate electrode 5a is formed on the opposite side to the sidewall on which the first N type channel layer is formed.

A portion of the ON current flows not through the first N type accumulation layer 15 formed on the sidewall of the trench 3, but through the N type drain layer 11a that is a lower region between the both trenches 3, directly toward the second N type accumulation layer 16 or the N type drain layer 11b below the bottom surface of the trench 3 in which the second gate electrode 5b is formed.

The ON current flown into the first N type accumulation layer 15 formed on the sidewall of the trench 3 in which the first gate electrode 5a is formed flows through the N type drain layer 11a interposed between the two trenches 3 toward the second N type accumulation layer 16 formed on the sidewall of the other trench 3 through the gate insulation film 4, as indicated by arrows. That is, the ON current flows through a large cross-sectional area of a region of the N type drain layer 11a interposed between the sidewalls of the both trenches 3.

In the case of the conventional bidirectional switch, on the other hand, only the N type drain layers 65a and 65b make the current path, and the region between the gate electrode 56a and the gate electrode 56b filled with the insulation film 64 cannot make a current path. Therefore, the ON resistance of the bidirectional switch according to the embodiment that has the broad current path is lower than the ON resistance of the conventional bidirectional switch that has the narrow current path. That makes the feature of the bidirectional switch according to the embodiment of this invention.

The ON current flown into the second N type accumulation layer 16 on the sidewall of the trench 3 in which the second gate electrode 5b is formed further flows through the second N type accumulation layer 16 toward the second accumulation layer 16 on the side of the bottom surface of the trench 3, and flows through the second N type channel layer (not shown) after joined by the ON current flown through the first N type accumulation layer 15 and the N type drain layer 11b outside the second N type accumulation layer 16, and together into the second source electrode 14 from the N+ type source layer 9. The path of the ON current from the first source electrode 13 to the second source electrode 14 is formed as described above.

Next, there is examined what determines a dielectric breakdown voltage of the bidirectional switch when the bidirectional switch is turned from the ON state to the OFF state. To turn the bidirectional switch from the ON state to the OFF state, when described referring to FIG. 3, the voltage applied to the second gate electrode 5b on the side of the second source electrode 14 to which the low voltage $V_L$ is applied is reduced from $V_L$+Vt in the ON state to $V_L$ and the voltage applied to the first gate electrode 5a on the side of the first source electrode 13 to which the high voltage $V_H$ is applied is reduced from $V_H+Vt$ in the ON state to $V_H$, as described above.

In this case, the first source electrode 13, the first gate electrode 5a and the P type body layer 6 connected with the first source electrode 13 through the first P+ type contact layer 8 are held at the high electric potential $V_H$. The second source electrode 14, the second gate electrode 5b and the P type body layer 6 connected with the second source electrode 14 through the second P+ type contact layer 10 are held at the low electric potential $V_L$.

Figure 3:
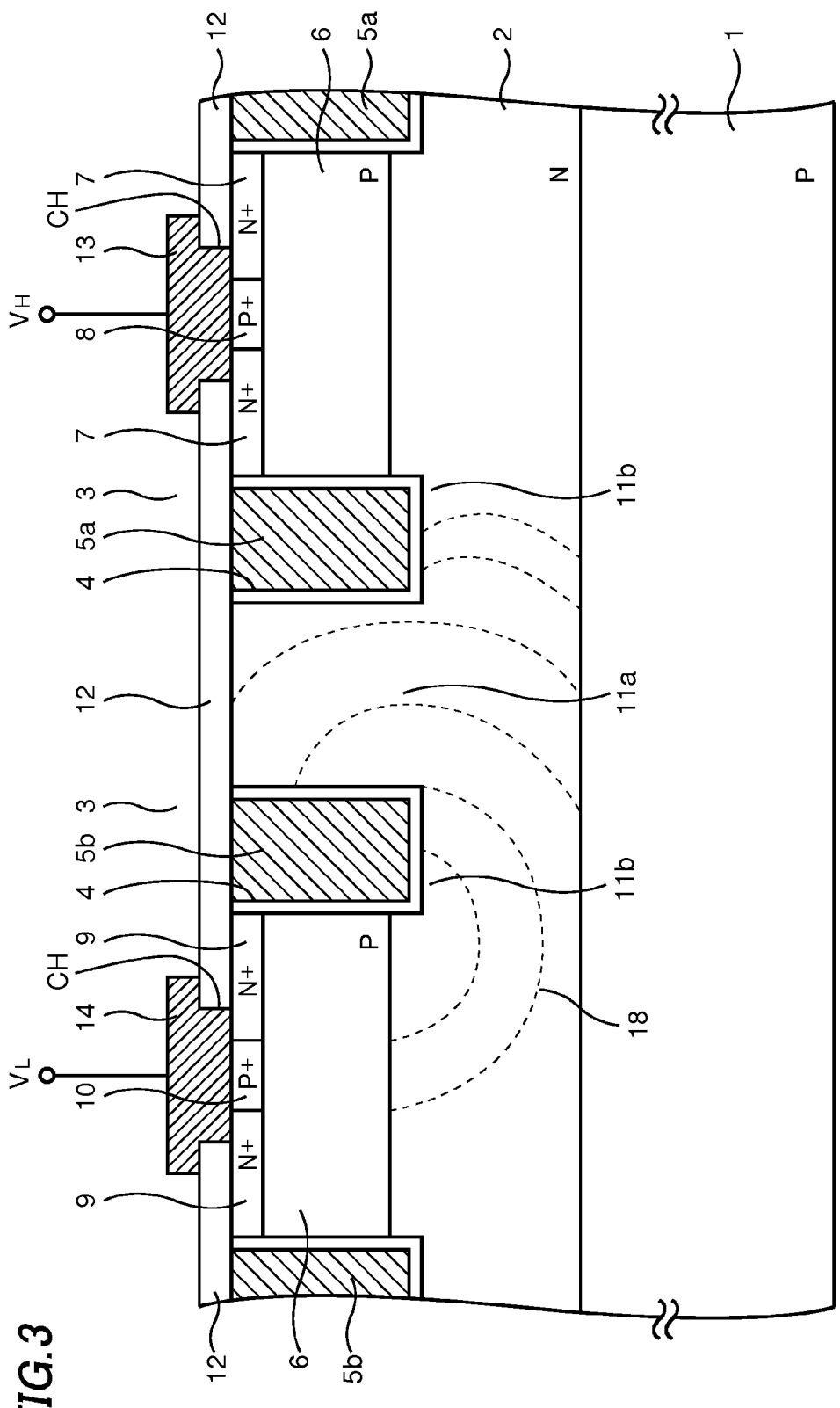
FIG. 3 is a cross-sectional view schematically showing extension of a depletion layer in the bidirectional switch according to the embodiment of this invention.

As a result, a depletion layer 18 depicted by near arc-shaped waveforms in FIG. 3 extends from the P type body layer 6 on a low electric potential side primarily toward the N type drain layers 11b and 11a that serve as electric field relaxation layers. The depletion layer 18 also extends over whole expanse of the N type drain layer 11a interposed between the sidewalls of the both trenches 3.

Since the first gate electrode 5a is at the high electric potential, the depletion layer 18 extends poorly at around a corner of the bottom surface of the trench 3 in which the first gate electrode 5a is formed on a side facing the second gate electrode 5b, which seems to determine the dielectric breakdown voltage of the bidirectional switch.

However, an electric field induced by an electric potential difference $V_H-V_L$ between the both gate electrodes 5a and 5b is applied to the N type drain layer 11a that is made of the N type well layer 2 between the both trenches 3 and serves as the electric field relaxation layer. The electric field is imposed on the gate insulation films 4 on the both trenches 3 and the N type drain layer 11a serving as the electric field relaxation layer interposed between them. In the case where the gate insulation films 4 are thin, most of the electric field is imposed on the N type drain layer 11a serving as the electric field relaxation layer interposed between the gate insulation films 4.

A width of the N type drain layer 11a that is the electric field relaxation layer in the region interposed between the both trenches 3 is small compared with a sum of widths of the N type drain layers 11b and 11a extending from below the P type body layer 6 at the low electric potential to the bottom surface of the trench 3 in which the first gate electrode 5a at the high electric potential is formed. Therefore, the dielectric breakdown of the N type drain layer 11a interposed between the both trenches 3 is caused at lower voltage. In conclusion, the dielectric breakdown voltage $BV_{DS}$ of the bidirectional switch in the OFF state is determined by the width x of the N type drain layer 11a interposed between the both trenches 3 shown in FIGS. 1A and 1B.

The same applies to the case of the conventional bidirectional switch in which split gate type first gate electrode 56a and the second gate electrode 56b are formed on both sidewalls of the single trench 54. The dielectric breakdown voltage of the bidirectional switch is determined by the distance between the gate electrodes 56a and 56b on the bottom surface of the trench 54. That is, the dielectric breakdown voltage is determined by the width x of the N type drain layer 65a interposed between the both gate electrodes 56a and 56b shown in FIG. 6 out of the N type drain layers 65a and 65b extending through the insulation film 55 along the bottom surface of the trench 54 in which the both gate electrodes 56a and 56b are formed.

Therefore, the conventional structure in which the insulation film 64 fills the region between the split type gate electrodes and the structure according to the embodiment in which the N type drain layer 11a is interposed between the two independent gate electrodes have similar value of the dielectric breakdown voltage $BV_{DS}$ to each other as long as the distance x between the both gate electrodes is identical to each other.

Figure 4:
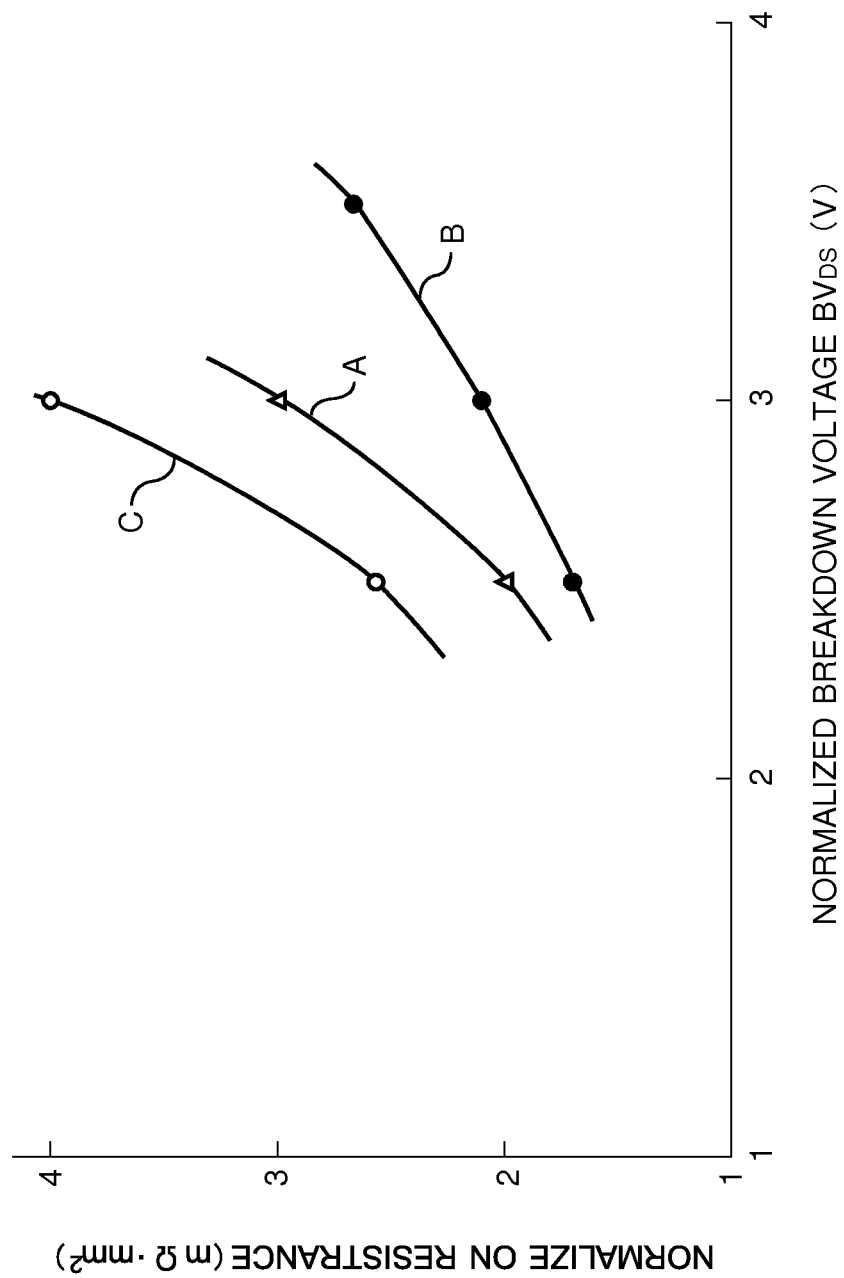
FIG. 4 is a graph showing correlation between a normalized source-drain dielectric breakdown voltage $BV_{DS}$ and a normalized ON resistance of each of structures of the bidirectional switch.

On the other hand, the bidirectional switch according to the embodiment is improved in the ON resistance in the ON state compared with the ON resistance of the bidirectional switch of the conventional structure. How the ON resistance of the bidirectional switch is improved will be explained referring to FIG. 4. FIG. 4 shows a correlation between the dielectric breakdown voltage $BV_{DS}$ of the bidirectional switch, which is represented on a horizontal axis, and the ON resistance of the bidirectional switch, which is represented on a vertical axis. The correlation with the conventional structure (structure A) is denoted by A, the correlation with the structure according to the embodiment (structure B) is denoted by B, and the correlation with a structure having independent gate electrodes as in the embodiment and the region between the both trenches being filled with the insulation film 17 instead of the N type drain layer 11a (structure C) is denoted by C in FIG. 5.

All three structures have essentially the same width of the drain layer as the width of the N type drain layer 11a between the first and second gate electrodes 5a and 5b in the structure B. The width of each of the gate electrodes 5a and 5b in the structure B according to the embodiment is about twice of the width of each of the gate electrodes 56a and 56b in the conventional structure A. The width of the gate electrodes in the structure B is the same as in the structure C, thus a difference in the ON resistances of the structures B and C is due to the difference whether the region between the both gate electrodes is filled with the N type drain layer 11a or with the insulation film 17.

FIG. 4 shows how the ON resistance varies by changing the material filling the region between the both gate electrodes from the conventional insulation film 17 as in the structure C to the N type drain layer 11a as in the structure B while the rest of the structure remains the same. A rate of improvement in the ON resistance becomes larger as the dielectric breakdown voltage $BV_{DS}$ increases.

FIG. 4 shows the ON resistance of the conventional structure A in which the width of each of the gate electrodes 56a and 56b is about a half of that in the structure B according to the embodiment. A width of a portion in the conventional structure A corresponding to the N type drain layer 11b is shorter than in the structure B by a difference between the width of the gate electrodes 56a and 56b and the width of the gate electrodes 5a and 5b. The ON resistance of the conventional structure is expected to be smaller accordingly to the reduced length of the portion in the conventional structure A corresponding to the N type drain layer 11b which is of high resistivity. However, the ON resistance is smaller with the structure B according to the embodiment, which has the larger widths of the gate electrodes 5a and 5b, thus increased length of the N type drain layer 11b.

Figure 5:
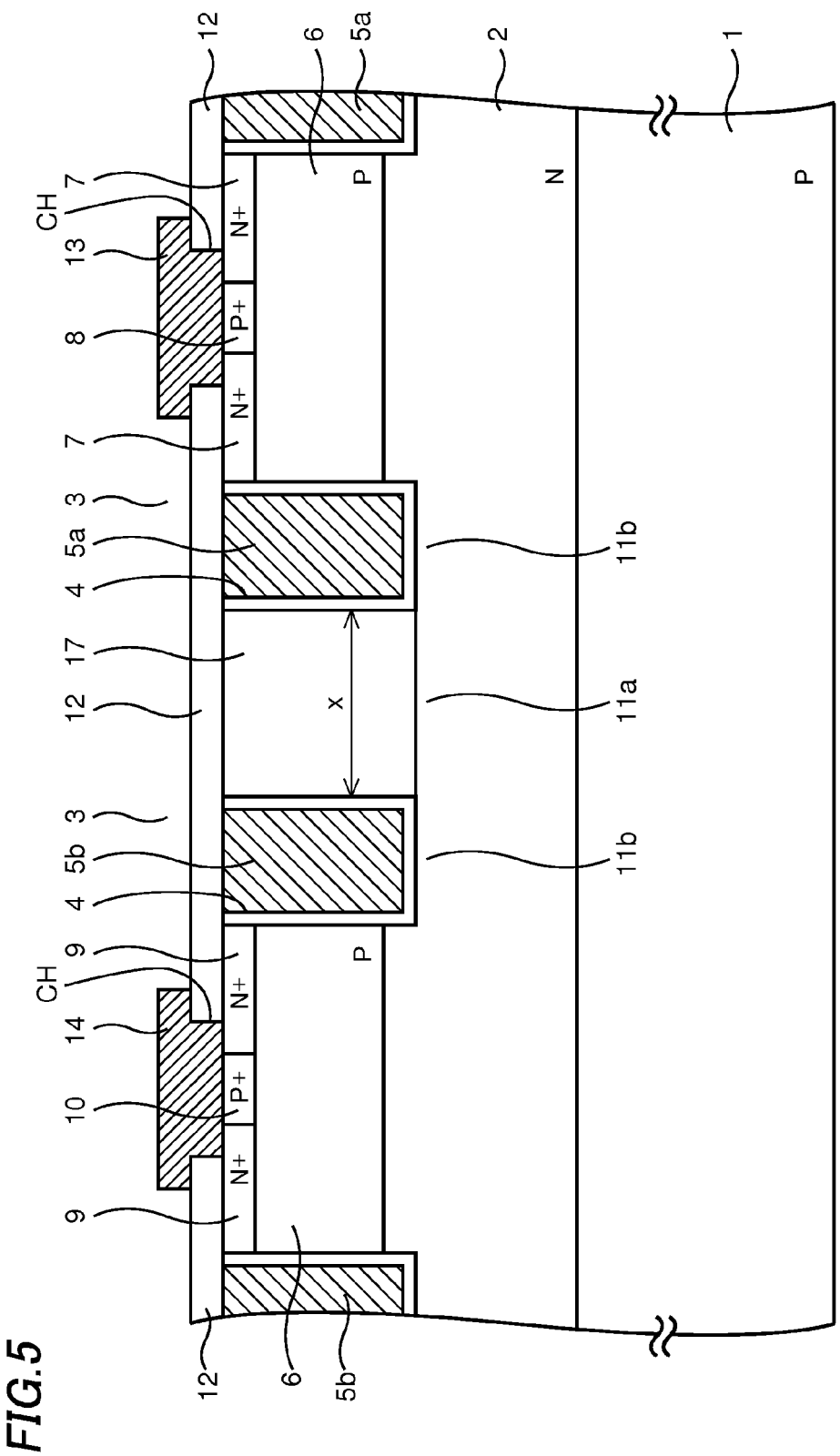
FIG. 5 is a cross-sectional view showing a bidirectional switch having the same structure of first and second gate electrodes as the bidirectional switch according to the embodiment, while a region between the both gate electrodes are filled with dielectric.

The improvement in the ON resistance of the bidirectional switch is a result of the change from the structure in which the region between the both gate electrodes 5a and 5b is filled with the insulation film 17 as shown in FIG. 5 to the structure in which the region between the both electrodes 5a and 5b is filled with the N type drain layer 11a as shown in FIG. 1B to make the path of the ON current broader. FIG. 4 shows that the improvement is more conspicuous with the bidirectional switch having the higher dielectric breakdown voltage $BV_{DS}$.

The ON resistance of the bidirectional switch of the structure B according to the embodiment could be further reduced if the widths of the gate electrodes 5a and 5b in the bidirectional switch according to the embodiment would be reduced to the same widths as the widths of the gate electrodes 56a and 56b in the conventional bidirectional switch. That is, the same ratio of improvement would be realized in the ON resistance of the bidirectional switch of the structure A as the ratio of improvement from the ON resistance of the bidirectional switch of the structure C to the ON resistance of the bidirectional switch of the structure B, so that the ON resistance lower than the ON resistance of the bidirectional switch of the structure B would be realized.

A manufacturing method of the bidirectional switch according to the embodiment of this invention is briefly described referring to FIGS. 1A and 1B. First, the P type semiconductor substrate 1 is provided, and phosphorus (P) or the like is thermally diffused into the P type semiconductor substrate 1 by a predetermined method to form the N type well layer 2, as shown in FIG. 1B. The N type well layer 2 may be formed by a predetermined epitaxial method.

Next, the plurality of trenches 3 extending from the surface to the inside of the N type well layer 2 is formed by predetermined anisotropic etching or the like. Next, the gate insulation film 4 extending from inner walls of the trenches 3 to the surface of the P type semiconductor substrate 1 is formed by a predetermined thermal oxidation method or the like. The gate insulation film 4 may be made of a silicon oxide film or a multi-layer film composed of a silicon oxide film and other insulation film.

Next, a polysilicon film is formed by a predetermined CVD method or the like to fill the trenches 3 and extend over the surface of the P type semiconductor substrate 1, and phosphorus (P) or the like is diffused into the polysilicon film by thermal diffusion or the like. Next, by etching back the polysilicon film by a predetermined method, there is formed a plurality of the first gate electrodes 5a and second gate electrodes 5b made of polysilicon which fills the trenches 3 and extends over the silicon oxide film 50, as shown in FIG. 1A.

After that, a dummy oxide film (not shown) is formed, and the plurality of P type body layers 6 is formed so that each P type body layer 6 is formed in every other column of N type well layer 2 that is interposed between a pair the of trenches 3 by implanting boron (B) by a predetermined ion implantation method or the like using a photo-resist mask or the like. The P type body layer 6 is formed up to a predetermined depth along the sidewall of the trench 3.

Next, the first N+ type source layer 7 and the second N+ type source layer 9 are formed alternately in each of the plurality of P type body layers 6 by implanting arsenic (As) or the like by a predetermined ion implantation method using a predetermined photo-resist mask or the like. The first P+ type contact layer 8 is formed in the first N+ type source layer 7 and the second P+ type contact layer 10 is formed in the second N+ type source layer 9 by implanting boron (B) or the like by a predetermined ion implantation method using a predetermined photo-resist mask or the like.

Next, the interlayer insulation film 12 is formed by a predetermined CVD method or the like. The first source electrode 13 connected to the first N+ type source electrode 7 and the like and the second source electrode 14 connected to the second N+ type source electrode 9 and the like through the contact holes CH formed in the interlayer insulation film 12 by a predetermined method are formed of aluminum or the like by a predetermined sputtering method and a photo-etching method. Also, there are formed the gate draw-out electrodes (not shown) each connected to each of the first and second gate electrodes 5a and 5b, respectively, through the contact hole CH formed in the interlayer insulation film 12 by a predetermined method.

A multi-layer wiring structure is adopted when necessary. A passivation film is deposited on the uppermost layer to complete the predetermined bidirectional switch. The bidirectional switch according to the embodiment of this invention can be manufactured by approximately the same method as ordinary manufacturing method of MOS transistors.

With the bidirectional switch according to the embodiment of this invention, the region between the sidewalls of both trenches in each of which the gate electrode of each of the two MOS transistors is formed can be used as the path of the ON current. Therefore, the ON resistance can be reduced compared with the conventional bidirectional switch.

What is claimed is:
1. A bidirectional switch comprising:
a semiconductor substrate of a first general conductivity type;
a semiconductor layer of a second general conductivity type disposed on the semiconductor substrate;
a plurality of trenches formed in the semiconductor layer so that a column is defined between each pair of the trenches;
a gate electrode disposed in each trench;
a plurality of body layers of the first conductivity type formed in the semiconductor layer so that a body layer exists in every other column of the semiconductor layer so as to form a transistor; and
a source layer of the second conductivity type formed in each body layer,
wherein a column of the semiconductor layer in which no body layer is formed is configured to operate as a common drain layer between two pairs of transistors.
2. The bidirectional switch of claim 1, wherein a width of the common drain layer determines a source-drain dielectric breakdown voltage of the bidirectional switch.
3. The bidirectional switch of claim 1, wherein in an ON state of the bidirectional switch a charge accumulation layer is formed around each trench, and an ON current flows from a charge accumulation layer of one transistor to a charge accumulation layer of another transistor through the common drain layer.

* * * * *